(12) United States Patent
Sabouret et al.

(10) Patent No.: US 8,193,530 B2
(45) Date of Patent: Jun. 5, 2012

(54) SEMICONDUCTOR DEVICE HAVING PAIRS OF PADS

(75) Inventors: Eric Sabouret, Saint-Ismier (FR); Laurent Hoareau, Grenoble (FR); Yves Salmon, Crolles (FR)

(73) Assignees: STMicroelectronics S.A., Montrouge (FR); STMicroelectronics (Crolles 2) SAS, Crolles Cedex (FR)

( * ) Notice: Subject to any disclaimer, the term of this patent is extended or adjusted under 35 U.S.C. 154(b) by 394 days.

(21) Appl. No.: 12/539,542

(22) Filed: Aug. 11, 2009

(65) Prior Publication Data

US 2010/0044886 A1   Feb. 25, 2010

(30) Foreign Application Priority Data

Aug. 22, 2008   (FR) ...................................... 08 55675

(51) Int. Cl.
    *H01L 27/04* (2006.01)
(52) U.S. Cl. ................... 257/48; 257/786; 257/E23.023
(58) Field of Classification Search ................ 257/48, 257/786, E23.023
    See application file for complete search history.

(56) References Cited

U.S. PATENT DOCUMENTS

| 6,972,487 | B2 * | 12/2005 | Kato et al. ............... 257/723 |
| 7,271,013 | B2 * | 9/2007 | Yong et al. ............... 438/14 |
| 2001/0001541 | A1 | 5/2001 | Bell |
| 2005/0098903 | A1 | 5/2005 | Yong et al. |
| 2006/0091535 | A1 | 5/2006 | Tsao et al. |

FOREIGN PATENT DOCUMENTS

| JP | 2002329742 A | 11/2002 |
| JP | 2007103792 A | 4/2007 |

OTHER PUBLICATIONS

FR Search Report cited in Application No. 0855675, dated Apr. 3, 2009 (2 pages).

* cited by examiner

*Primary Examiner* — Minh-Loan T Tran
(74) *Attorney, Agent, or Firm* — Gardere Wynne Sewell LLP

(57) ABSTRACT

An integrated-circuit semiconductor device includes external electrical connection pads on one face and electrical connection vias under said pads. The electrical connection vias are arranged with a defined pitch in a defined direction. Each via is respectively associated with one of a plurality of adjacent zones of the face. These zones extend perpendicularly to the pitch direction. The electrical connection pads are grouped in adjacent pairs. An insulation space is located between the pads of each pair of electrical connection pads. In a direction perpendicular to the pitch direction, the pads in the pair are spaced apart. The pads of each pair of electrical connection pads extend over a pair of adjacent zones and are associated with two adjacent vias.

19 Claims, 2 Drawing Sheets

SEMICONDUCTOR DEVICE HAVING PAIRS OF PADS

PRIORITY CLAIM

The present application claims priority from French Application for Patent No. 08 55675 filed Aug. 22, 2008, the disclosure of which is hereby incorporated by reference.

BACKGROUND OF THE INVENTION

1. Technical Field of the Invention

The present invention relates to the field of integrated-circuit semiconductor devices.

2. Description of Related Art

In integrated-circuit semiconductor devices, it is common practice to produce, in a final layer, aligned external electrical connection vias arranged with a defined pitch and to produce rectangular external electrical connection pads that are formed on top of the vias in order to solder electrical connection wires thereto. These rectangular electrical connection pads are placed beside one another along the pitch direction and have between them an insulation space that extends perpendicular to the pitch direction.

In certain cases, the rectangular electrical connection pads are elongated in a direction perpendicular to the pitch direction so as to have a spot for placing test probes into contact with them, alongside the electrical connection wires, in such a way that the contact points of the test probes and the soldered joints of the electrical connection wires are aligned perpendicular to the pitch direction.

Such an arrangement limits the possibility of reducing the pitch since, for a given cross section of the electrical connection wires, it is necessary to provide a minimum area on the electrical connection pads for the soldering, fixing a minimum width of the pads, while still leaving a spot available for placing the test probes.

SUMMARY OF THE INVENTION

According to one embodiment, an integrated-circuit semiconductor device is proposed that includes external electrical connection pads on one face and electrical connection vias emerging beneath the pad respectively.

The electrical connection vias are arranged with a defined pitch in a defined direction, these being respectively associated with successive zones of said face that extend perpendicularly to this pitch direction.

The electrical connection pads are grouped in adjacent or successive pairs, it being possible for the pads of each pair of electrical connection pads to have an insulation space between them such that, perpendicular to the pitch direction, these pads are spaced apart, which pads of each pair of electrical connection pads may extend over a pair of adjacent or successive zones associated with two adjacent or successive vias.

Said zones in an implementation are rectangular and neighboring by their long sides.

Said insulation space in an implementation extends mainly along said pitch direction.

Said insulation space in an implementation has two successive parts offset perpendicular to said pitch direction.

The electrical connection pads of said pairs of pads are symmetrical with respect to the point of symmetry of said pairs of zones.

The peripheral edges of the electrical connection pads of each pair of pads correspond substantially to the peripheral edges of each pair of zones.

The electrical connection vias of each pair of vias in an implementation are offset perpendicular to said pitch direction.

In an embodiment, an integrated circuit device comprises: a top surface including a first rectangular zone extending perpendicular to an edge of the device and a second zone, adjacent the first zone, also extending perpendicular to the edge; a first via positioned below the first rectangular zone; a second via positioned below the second rectangular zone; a first contact on the top surface and in electrical contact with the first via, the first contact having an extent which covers a first portion of the first rectangular zone and a first portion of the second rectangular zone; and a second contact on the top surface and in electrical contact with the second via, the second contact having an extent which covers a second portion of the first rectangular zone and a second portion of the second rectangular zone.

In an embodiment, an integrated circuit device comprises: a top surface; a first via; a second via; a first contact on the top surface and in electrical contact with the first via, the first contact being sized and shaped to support both a first bonding wire solder zone over the first via and an adjacent first test pad contact zone; a second contact on the top surface and in electrical contact with the second via, the second contact being sized and shaped to support both a second bonding wire solder zone over the second via and an adjacent second test pad contact zone; wherein the first bonding wire solder zone and second test pad contact zone are adjacent each other in a direction perpendicular to the edge, and wherein second bonding wire solder zone and first test pad contact zone are adjacent each other in the direction perpendicular to the edge.

BRIEF DESCRIPTION OF THE DRAWINGS

One particular integrated-circuit semiconductor device will now be described by way of non-limiting example and illustrated by the drawings in which.

DETAILED DESCRIPTION OF THE DRAWINGS

Figure 1:
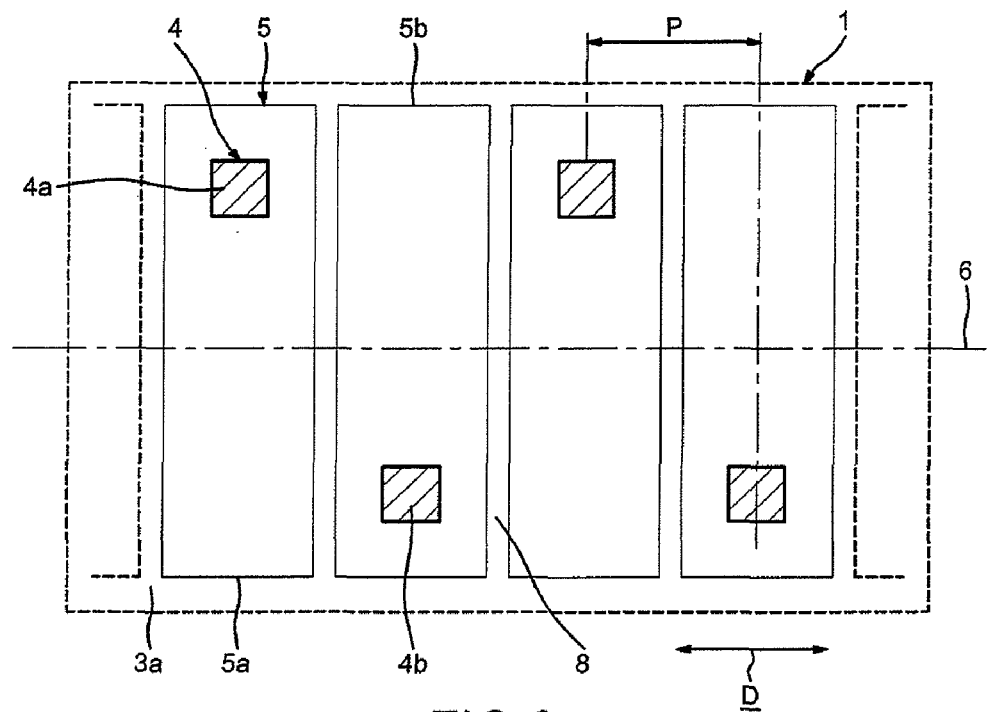
FIG. 1 shows a top view of a semiconductor device before formation of external electrical connection pads.

The semiconductor device 1 includes external electrical connection pads 2, formed on a face 3a, and electrical connection vias 4 formed in an anterior layer 3, said via wires emerging beneath the external electrical connection pads 2 respectively.

The electrical connection vias 4 belong to an integrated electrical connection network for selectively connecting the external electrical connection pads 2 to electrical contacts of integrated electronic components or active parts (not shown).

As shown in FIG. 1, the electrical connection vias 4 are arranged with a defined pitch P in a defined direction D along an edge of the circuit.

Successive identical arbitrary zones 5, for example of rectangular shape, may be respectively assigned, on the face 3a, to the electrical connection vias 4, said zones being neighboring by or at a short distance from their long sides that extend perpendicular to the pitch direction D, their short sides being aligned in such a way that the rectangular zones 5 are also arranged with the pitch P. For example, the rectangular zones are two to three times longer than they are wide.

In the pitch direction D, the electrical connection vias 4 may be placed in the middle of the rectangular zones 5, whereas in the direction perpendicular to the pitch direction D the electrical connection vias may be alternately offset with respect to the axis of symmetry 6 of the rectangular zones 5, this axis of symmetry extending along the pitch direction D. Each via 4 may be formed from several vias grouped together.

The electrical connection vias 4 may be grouped in adjacent or successive pairs 4a and 4b and the rectangular zones 5 may be grouped in associated adjacent or successive pairs 5a and 5b.

Figure 2:
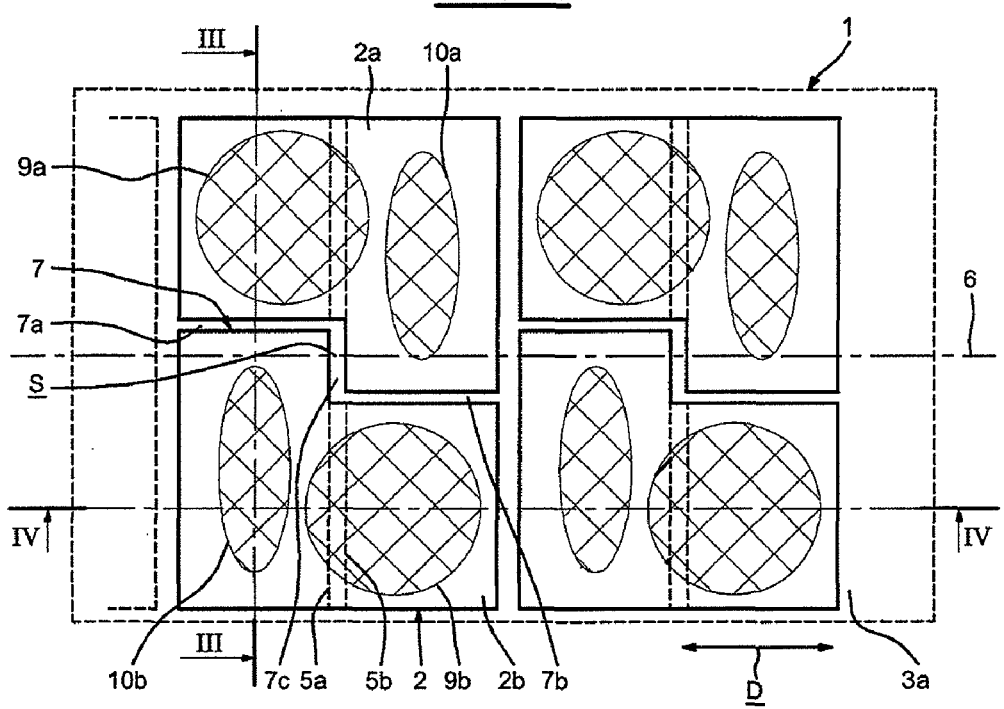
FIG. 2 shows a top view of a semiconductor device after formation of external electrical connection pads.
Figure 3:
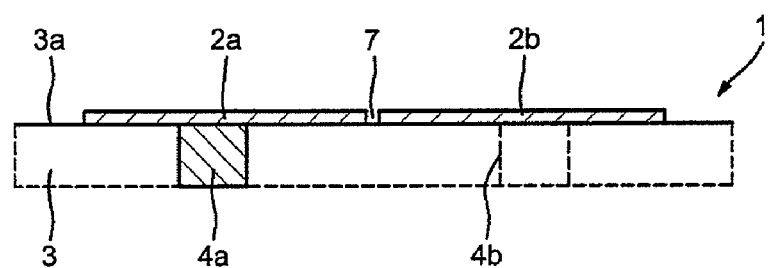
FIG. 3 shows a cross section III-III of the semiconductor device of FIG. 2 perpendicular to the pitch direction.
Figure 4:
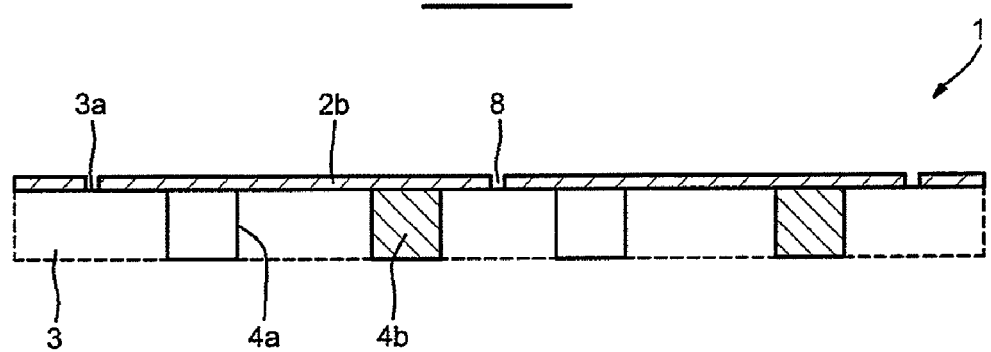
FIG. 4 shows a cross section on IV-IV of the semiconductor device of FIG. 2 along the pitch direction.

As shown in FIG. 2, the electrical connection pads 2 may each have an L shape and may be grouped in pairs 2a and 2b in the following manner.

The electrical connection pads 2a and 2b may have a small insulation space 7 on either side of which, along the pitch direction D, these pads 2a and 2b are formed, and extend over the two rectangular zones 5a and 5b.

For example, the insulation space 7 extends mainly along the pitch direction D and has two end parts 7a and 7b, which are located on either side of the axis of symmetry 6 and slightly offset with respect to this axis, and has a short central part 7c joining these end parts 7a and 7b together.

For example, the peripheral edges of the electrical connection pads 2a and 2b correspond substantially to the peripheral edges of the pairs of rectangular zones 5a and 5b.

Thus, the electrical connection pads 2a and 2b may extend, along the pitch direction D, over the entire defined width between the opposed long sides of the rectangular zones 5a and 5b, passing over the top of the space 8 separating these rectangular zones 2a and 2b, and extend, perpendicularly to the pitch direction D, between the insulation space 7 and the short sides of the rectangular zones 5a and 5b.

In addition, the electrical connection pads 2a and 2b may be symmetrical with respect to the point of symmetry S of the two rectangular zones 5a and 5b taken together.

As shown in FIG. 2, it is then possible to have, on the front faces of the electrical connection pads 2a and 2b, approximately circular soldering zones 9a and 9b, the diameter of which is larger than the width of the rectangular zones 5a and 5b, and contact zones 10a and 10b neighboring the soldering zones 9a and 9b in the pitch direction D, the soldering zones 9a and 9b being adjacent to the shortest sides of the electrical connection pads 2a and 2b, taken perpendicular to the pitch direction D.

The soldering zones 9a and 9b are intended to receive spots of solder for the external electrical connection wires of the semiconductor device 1 and the contact zones 10a and 10b are intended to be contacted by contact probes, for example of test instruments.

Thus, it is possible to reduce the magnitude of the pitch P of the electrical connection vias 4 without having to reduce the area of the soldering zones 9a and 9b.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit device, comprising:
    a top surface including a first rectangular zone extending perpendicular to an edge of the device and a second rectangular zone, adjacent the first rectangular zone, also extending perpendicular to the edge;
    a first via positioned below the first rectangular zone;
    a second via positioned below the second rectangular zone;
    a first contact on the top surface and in electrical contact with the first via, the first contact having an extent which covers a first portion of the first rectangular zone and a first portion of the second rectangular zone; and
    a second contact on the top surface and in electrical contact with the second via, the second contact having an extent which covers a second portion of the first rectangular zone and a second portion of the second rectangular zone.

2. The device of claim 1 wherein the first via is positioned under the first portion of the first rectangular zone and the second via is positioned under the second portion of the second rectangular zone.

3. The device of claim 2 wherein the first contact includes a solder zone positioned over the first via in the first rectangular zone and a test pad zone positioned over the second rectangular zone, and wherein the second contact includes a solder zone positioned over the second via in the second rectangular zone and a test pad zone positioned over the first rectangular zone.

4. The device of claim 2 wherein the extent of each of the first and second contacts has an L shape.

5. The device of claim 1 wherein the first via is positioned closer to the edge than the second via.

6. An integrated circuit device, comprising:
    a top surface;
    a first via;
    a second via;
    a first contact on the top surface and in electrical contact with the first via, the first contact being sized and shaped to support both a first bonding wire solder zone over the first via and an adjacent first test pad contact zone;
    a second contact on the top surface and in electrical contact with the second via, the second contact being sized and shaped to support both a second bonding wire solder zone over the second via and an adjacent second test pad contact zone;
    wherein the first bonding wire solder zone and second test pad contact zone are adjacent each other in a direction perpendicular to the edge, and wherein second bonding wire solder zone and first test pad contact zone are adjacent each other in the direction perpendicular to the edge.

7. The device of claim 6 wherein the first via is positioned closer to the edge than the second via.

8. The device of claim 6 wherein the shape of each of the first and second contacts has an L shape.

9. An integrated circuit device, comprising:
    a top surface including a first zone extending perpendicular to an edge of the device and a second zone, adjacent the first zone, also extending perpendicular to the edge;
    a first via positioned below the first zone;
    a second via positioned below the second zone;
    a first contact on the top surface and in electrical contact with the first via, the first contact having an extent which covers at least a first portion of the first zone and a first portion of the second zone; and
    a second contact on the top surface and in electrical contact with the second via, the second contact having an extent which covers at least a second portion of the first zone and a second portion of the second zone.

10. The device according to claim 9, wherein said zones are rectangular and neighboring by their long sides.

11. The device according to claim 9, wherein the first and second contacts are separated by an insulation space that extends mainly along a via pitch direction.

12. The device according to claim 11, wherein said insulation space has two successive parts offset perpendicular to said pitch direction.

13. The device according to claim 9, wherein the first and second contacts are symmetrical with respect to a point of symmetry.

14. The device according to claim 9, wherein peripheral edges of the first and second contacts correspond substantially to peripheral edges of said first and second zones.

15. The device according to claim 9, wherein the first and second vias are offset perpendicular to a via pitch direction.

16. The device of claim 9 wherein the first via is positioned under the first portion of the first zone and the second via is positioned under the second portion of the second zone.

17. The device of claim 16 wherein the first contact includes a solder zone positioned over the first via in the first zone and a test pad zone positioned over the second zone, and wherein the second contact includes a solder zone positioned over the second via in the second zone and a test pad zone positioned over the first zone.

18. The device of claim 9 wherein each of the first and second contacts has an L shape.

19. The device of claim 9 wherein the first via is positioned closer to the edge than the second via.

* * * * *